US006725564B2

(12) United States Patent
Hunter et al.

(10) Patent No.: US 6,725,564 B2
(45) Date of Patent: Apr. 27, 2004

(54) PROCESSING PLATFORM WITH INTEGRATED PARTICLE REMOVAL SYSTEM

(75) Inventors: Reginald W. Hunter, Round Rock, TX (US); Joel Brad Bailey, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 144 days.

(21) Appl. No.: 10/006,020

(22) Filed: Dec. 6, 2001

(65) Prior Publication Data

US 2003/0037456 A1 Feb. 27, 2003

Related U.S. Application Data

(60) Provisional application No. 60/315,102, filed on Aug. 27, 2001.

(51) Int. Cl.[7] .............................. F26B 19/00; C25F 5/00
(52) U.S. Cl. ............................. 34/230; 34/58; 34/665; 34/210; 134/1.3; 134/33; 134/902
(58) Field of Search ................ 34/58, 59, 85, 34/664, 665, 210, 230, 232, 236; 134/1.3, 32, 33, 37, 902

(56) References Cited

U.S. PATENT DOCUMENTS

| 5,298,720 A | 3/1994 | Cuomo et al. ......... 219/121.43 |
| 5,387,777 A | 2/1995 | Bennett et al. ........ 219/121.43 |
| 5,522,933 A | 6/1996 | Geller et al. ............. 118/723 E |
| 5,531,862 A | 7/1996 | Otsubo et al. ............ 156/643.1 |
| 5,665,609 A | 9/1997 | Mori ............................ 438/16 |
| 5,727,332 A | 3/1998 | Thrasher et al. .............. 34/277 |
| 5,820,329 A | 10/1998 | Derbinski et al. .......... 414/225 |
| 5,849,135 A | 12/1998 | Selwyn ........................ 156/345 |
| 5,954,982 A * | 9/1999 | Sogard ........................ 219/502 |
| 5,969,934 A | 10/1999 | Larsen ........................ 361/234 |
| 5,971,586 A | 10/1999 | Mori ..................... 364/468.15 |
| 6,106,634 A | 8/2000 | Ghanayem et al. ........... 134/19 |
| 6,192,601 B1 | 2/2001 | Ghanayem et al. ........... 34/406 |
| 6,540,803 B2 * | 4/2003 | Whalen ..................... 55/385.1 |

* cited by examiner

*Primary Examiner*—Pamela A Wilson
(74) *Attorney, Agent, or Firm*—Moser, Patterson & Sheridan, LLP

(57) ABSTRACT

Embodiments of the invention generally provide a multi-stage semiconductor processing tool, wherein the processing tool includes a first transfer chamber having a first substrate transfer robot positioned therein and at least one load lock chamber in communication with the first transfer chamber. The at least one load lock is generally configured to communicate substrates into and out of the first transfer chamber. Further, the processing tool includes at least one substrate cleaning chamber positioned in communication with the first transfer chamber. The at least one substrate cleaning chamber generally includes a substrate support member, a broad-band actuation device in communication with the substrate support member, and a particle removal device configured to sweep away dislodged particles from an area proximate the substrate surface. The processing tool further includes a second transfer chamber having a second substrate transfer robot positioned therein, the second transfer chamber being in selective communication with the first transfer chamber, and at least one substrate processing chamber in communication with the second transfer chamber.

15 Claims, 13 Drawing Sheets

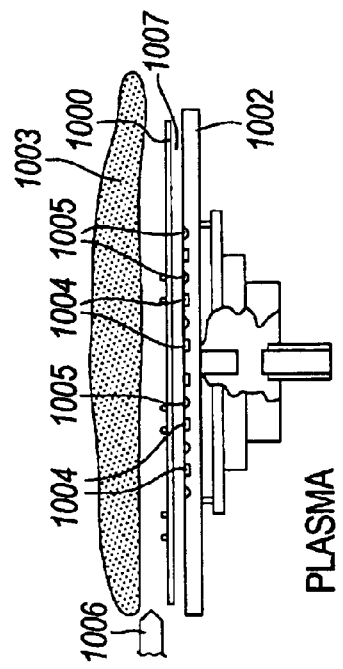
FIG. 10A  CLAMP
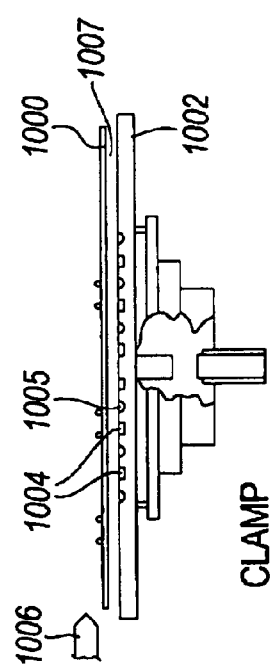
FIG. 10B  PLASMA
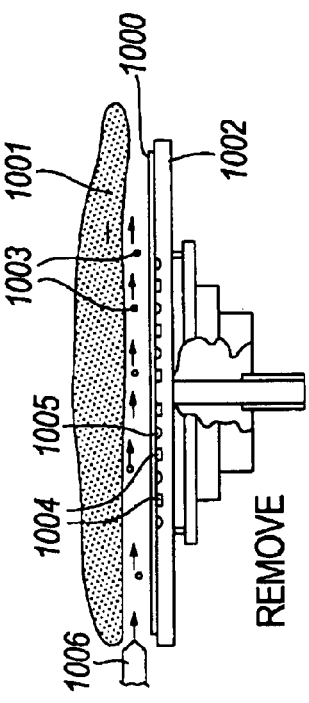
FIG. 10C  ACTUATE
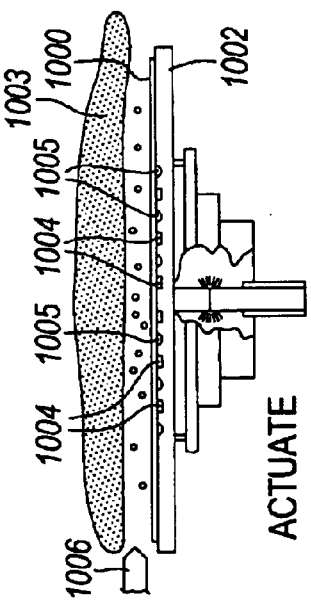
FIG. 10D  REMOVE

PROCESSING PLATFORM WITH INTEGRATED PARTICLE REMOVAL SYSTEM

CROSS REFERENCE TO RELATED APPLICATIONS

This application is a utility patent application that claims benefit of U.S. patent application Ser. No. 60/315,102, filed Aug. 27, 2001, which is hereby incorporated by reference in it's entirety.

BACKGROUND OF THE INVENTION

1. Field of the Invention

The present invention generally relates to an apparatus and method for removing particles from substrates.

2. Background of the Related Art

Reliably producing semiconductor device features in the sub-quarter micron and smaller size range is a key technology for the next generation of very large scale integration (VLSI) and ultra large-scale integration (ULSI) of semiconductor devices. However, as the fringes of circuit technology are advanced, shrinking feature dimensions places seemingly insurmountable demands upon conventional processing capabilities. For example, conventional semiconductor processing apparatuses and methods configured to manufacture devices with features larger than a quarter micron are not nearly as sensitive to sub-quarter micron size particle contaminants as newer devices having sub-quarter micron sized features. The smaller features of newer devices make it much easier for a sub-quarter micron sized particle to electrically short features. As a result thereof, conventional clean room technology, processing techniques, and substrate cleaning techniques capable of removing and/or avoiding the generation of particles larger than a quarter micron have been acceptable for conventional device manufacture. However, as the size of features in sub-quarter micron devices continues to decrease, device sensitivity to sub-quarter micron sized particles increases substantially, as a single quarter micron sized particle may electrically short two device features together and render the device defective or inoperable. Therefore, the removal of contaminant particles from semiconductor substrates is a key focus in the manufacture of sub-quarter micron and smaller sized semiconductor features.

In order to maintain acceptable device yields, the semiconductor manufacturing industry has already paid considerable attention to obtaining a high standard of cleanliness during the manufacture of semiconductor devices. Clean room technology in particular has evolved in response to contamination issues, and therefore, particle deposition onto substrates as a result of exposure to clean room environments is generally a minority source of substrate contamination. The majority of substrate contamination generally originates from the process tools, materials, and/or interior walls of the processing chambers themselves. Accordingly, manufacturing techniques often incorporate cleaning processes before, during, and/or after one or more of the substrate manufacturing process steps in order generate substrates having minimal particle contamination thereon. As a result, cleaning processes in conventional semiconductor fabrication lines often account for approximately 30 percent or more of the processing time in the manufacture of a device.

An example of a conventional particle cleaning apparatus and method may be found in U.S. Pat. No. 5,849,135 to Selwyn. Selwyn broadly describes a system for particle contamination removal from semiconductor wafers using a plasma and a mechanical resonance agitator. The method and apparatus of Selwyn forms a radio frequency (RF) driven plasma sheath proximate the surface of the substrate having particle contamination thereon. The substrate surface having the contamination particles thereon is bombarded by positive ions and electrons from the plasma. Additionally, a mechanical resonance vibration device is used to introduce a continual vibration into the substrate in a direction perpendicular to its surface. The combination of the bombardment of the particles by the plasma and the continual mechanical vibration operates to break the bonds between the particles on the substrate surface and the substrate surface itself. Once this bond is broken, the particles move away from the surface of the substrate into the plasma sheath and become negatively charged through contact with the electrons in the plasma. This negative charge operates to attract the particles further into the plasma, and therefore, keeps the particles from redepositing on the substrate surface. Additionally, a flowing gas may be introduced into the plasma in a direction parallel to the surface of the substrate, which may operate to further facilitate moving the dislodged particle away from the substrate surface and out of the plasma itself.

FIG. 1 illustrates a conventional substrate cleaning apparatus having a vacuum chamber 30, which includes an RF electrode 10 and a ground electrode 12. RF electrode 10 is capacitively coupled to an RF power source 18. A retaining ring having clamps 26 thereon is suspended above the substrate 14 to restrict substrate travel. Plasma is formed between the RF electrode 10 and the ground electrode 12 when RF energy is applied to the RF electrode 10 by the RF power source 18. A plasma sheath 22 is located above the substrate 14 and below RF electrode 10. The substrate 14 is caused to vibrate at approximately 10 kHz by means of a conducting post 28 that passes through the walls of vacuum chamber 30 and which is driven by a mechanical vibrator 34. A showerhead 38 is used to introduce a gas into vacuum chamber 30 via an inlet tube, which generally establishes a radial gas flow above the substrate surface. A pair of vacuum pumps 46 permit vacuum chamber 30 to be operated in the 1–10 torr range while the radial gas flow is generated. Strong drag forces generated by the high gas flow rate operate to drive the particulate matter out of the plasma and into the pumping ports of the chamber.

Other conventional apparatuses and methods, use reactive gasses in conjunction with mechanical agitation to remove contamination particles from the surface of a substrate. Reactive gasses are used in an attempt to increase the cleaning efficiency, as conventional cleaning apparatuses not using reactive gases generate a cleaning efficiency that is approximately 70 percent for 1.25 micron size particles. However, even these reactive gas-based cleaning apparatuses fall short of sufficiently removing particles from substrate surfaces for purposes of semiconductor manufacturing, and therefore, there is a need for an apparatus capable of efficiently removing particles from substrates sufficient for use in semiconductor manufacturing processes.

SUMMARY OF THE INVENTION

Embodiments of the invention generally provide a multistage semiconductor processing tool, wherein the processing tool includes a first transfer chamber having a first substrate transfer robot positioned therein and at least one load lock chamber in communication with the first transfer chamber. The at least one load lock is generally configured to communicate substrates into and out of the first transfer chamber. Further, the processing tool includes at least one substrate cleaning chamber positioned in communication with the first transfer chamber. The at least one substrate cleaning chamber generally includes a substrate support member, a broadband actuation device in communication with the substrate support member, and a particle removal device configured to sweep away dislodged particles from an area proximate the substrate surface. The processing tool further includes a second transfer chamber having a second substrate transfer robot positioned therein, the second transfer chamber being in selective communication with the first transfer chamber, and at least one substrate processing chamber in communication with the second transfer chamber.

Embodiments of the invention further provide a semiconductor processing tool having a central transfer enclosure, a substrate transfer robot positioned in the central transfer enclosure, at least one substrate processing chamber in communication with the central transfer chamber, and at least one load lock chamber in communication with the central transfer enclosure. Further the processing tool is configured such that at least one of the substrate processing chambers are a particle removal chamber. The particle removal chamber generally includes a substrate support member having a broadband actuator positioned in a stem portion and a reinforcement member positioned between the stem portion and a substrate receiving member.

BRIEF DESCRIPTION OF DRAWINGS

FIGS. 10A–10D illustrate an exemplary method for removing particles from a substrate using an air bearing, a vacuum chuck, and an air knife.

DETAILED DESCRIPTION OF THE INVENTION

A. Overall System Configuration

Figure 1:
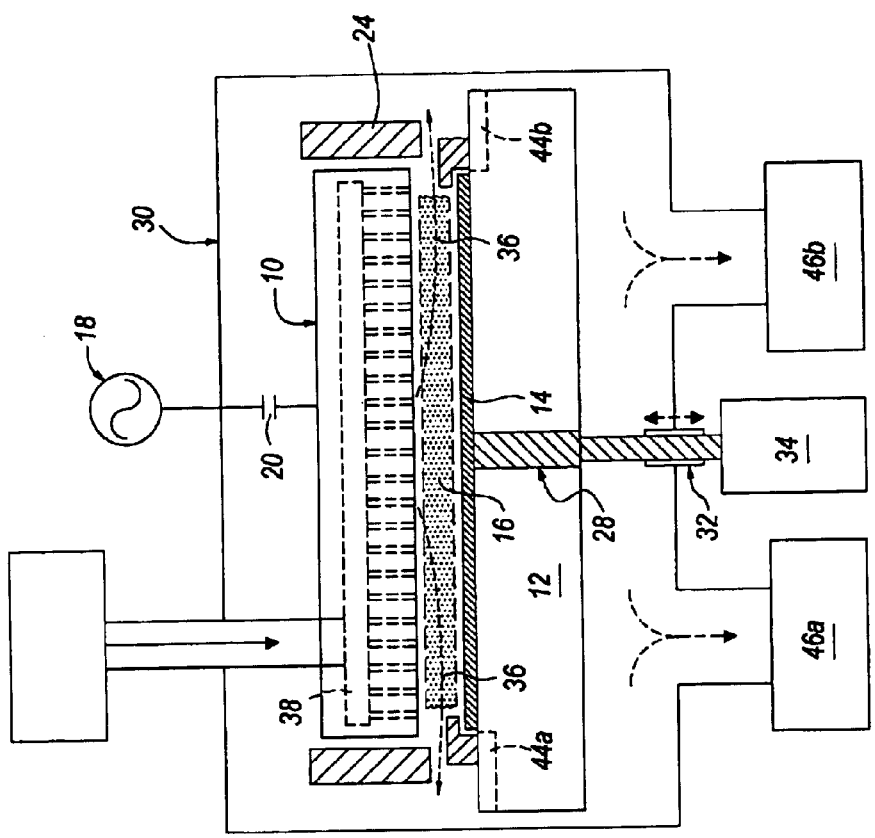
FIG. 1 illustrates a conventional substrate cleaning apparatus.
Figure 2:
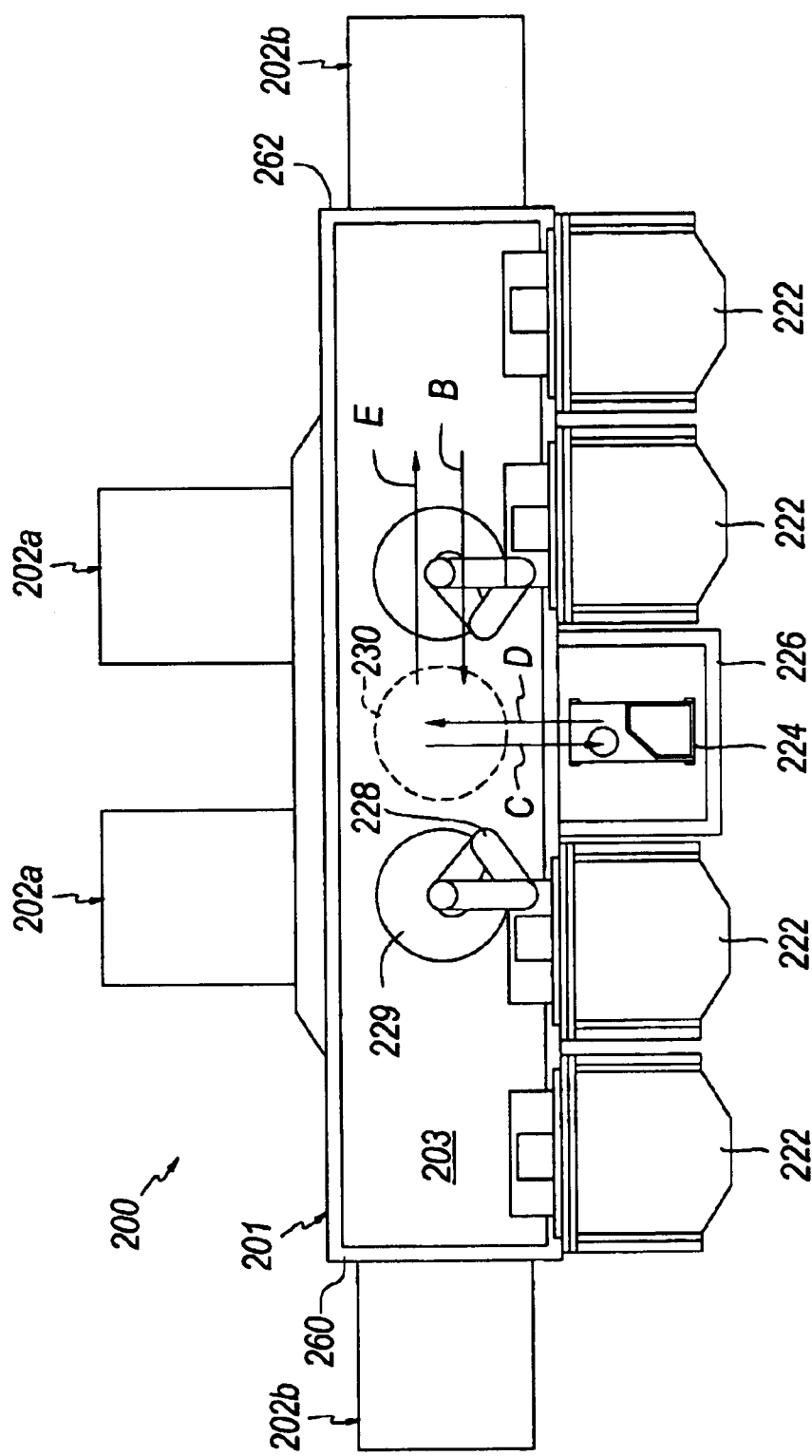
FIG. 2 illustrates a perspective view of an exemplary processing system incorporating the cleaning apparatus of the invention.

FIG. 2 illustrates one embodiment of a processing system 200 according to aspects of the invention. System 200 includes a factory interface 201 having at least one substrate processing chamber 202a, 202b attached thereto. Factory interface 201 generally operates to transfer substrates from substrate pods seated on pod loaders 222 through an atmospheric pressure clean environment/enclosure 203 to a processing chamber 202a, 202b. The clean environment in enclosure 203 is generally provided through air filtration processes, such as, HEPA filtration, for example. Factory interface 201 may also include a substrate orienter/aligner 224 that is used to properly align the substrates prior to processing. Substrate aligner 224 may be located in a small side chamber 226 attached to factory interface 201, or alternatively, orientor 224 may be positioned within enclosure 203 of factory interface 201 itself. At least one substrate transfer robot 228 is positioned in enclosure 203 to transport substrates between various positions/locations within enclosure 203, and to other locations in communication therewith. Robot 228 may be configured to travel along a track system within enclosure 203 from a first end 260 to a second end 262 of chamber 203 in the directions indicated by arrows "E" and "B". Alternatively, two robots 229 may be fixedly positioned in enclosure 203 to transfer substrates between select groups of chambers or other areas in communication with enclosure 203.

Processing chambers 202a, 202b may be a combination of cleaning chambers, metrology/inspection chambers, and/or other chambers used in substrate processing. For example, chambers 202b may be metrology/inspection chambers, while chambers 202a may be cleaning chambers. Metrology/inspection chambers, as used herein, generally refers to a chamber that is used to detect particles on a substrate or to measure the integrity of devices formed on the substrate. Cleaning chambers, as used herein, generally refers to chambers used to remove particles from substrate surfaces. In configurations using a metrology/inspection chamber 202b, substrates may be examined in metrology/inspection chambers 202b before and/or after being processed in one of cleaning chambers 202a. In configurations using a metrology/inspection chamber 202b, robot 228 may first position substrate 229 in the metrology/inspection chamber 202b for analysis of the substrate and any particles residing thereon. The analysis of the substrate and particles thereon may be controlled, for example, by a microprocessor controller configured to receive input from measuring devices in chamber 202b and output control signals based upon the inputs. The analysis of substrate 229 by metrology/inspection chamber 202b may then be used to calculate parameters used in the cleaning process. Alternatively, the metrology/inspection chamber may be used to check substrates for particles after a cleaning process is complete, and therefore, determine if additional cleaning of the substrate is necessary In another embodiment of the invention, a substrate cleaning apparatus may be positioned within enclosure 203 at location 230, as indicated by the dotted lines. In this configuration, a substrate 229 may be removed from a cassette and placed directly on location 230 for cleaning. In this embodiment chambers 202a and 202b may be used for alternative substrate processing tasks.

In a typical substrate loading and processing procedure, cassettes having substrates therein are placed in pod loaders 222. Robot 228 extends into the cassette positioned on a particular pod loader 222 and removes a substrate 229 therefrom in the direction indicated by arrow "A". If the cleaning process requires substrate alignment, robot 228 may position substrate 229 on a substrate aligner 224 in the direction of arrow "C". After the substrate aligner 224 aligns the wafer, the robot 228 retrieves the substrate in the direction of arrow "D". Thereafter, robot 228 may place substrate 229 in a metrology chamber 202b for analysis of the particles on the substrate. Once the analysis is complete, substrate 229 may be placed in cleaning chamber 202a by robot 228. Once the cleaning process is complete, robot 228 may place the cleaned substrate 229 back in a cassette for removal from the processing system. Alternatively, the inspection process may be eliminated and the robot may simply remove a substrate 229 from a cassette and place the substrate directly into a cleaning chamber 202a for processing. Once the cleaning process is complete, robot 228 may return the substrate 229 to a cassette.

Figure 12:
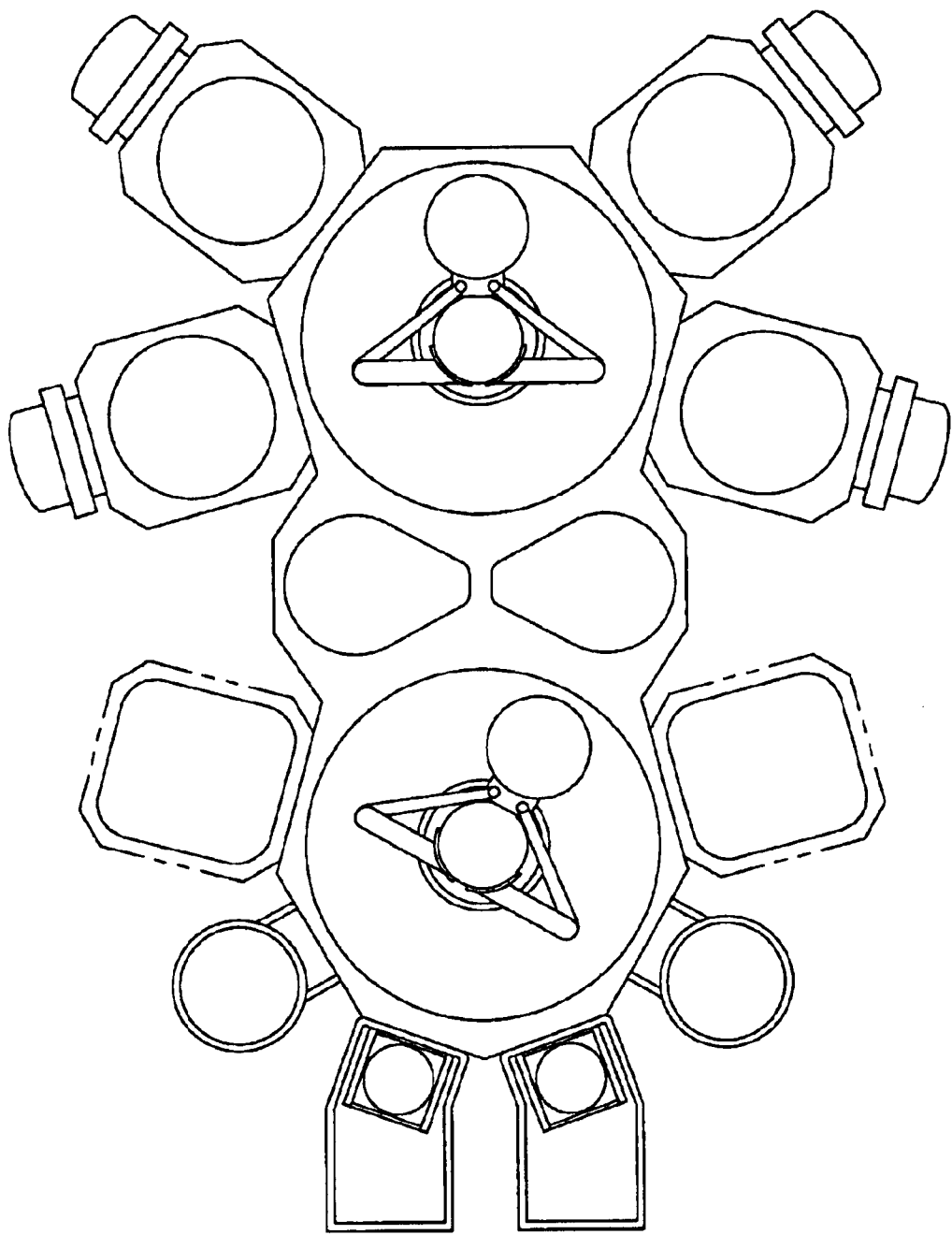
FIG. 12 illustrates an exemplary Endura processing platform implementing an embodiment of the cleaning chamber of the invention.
Figure 13:
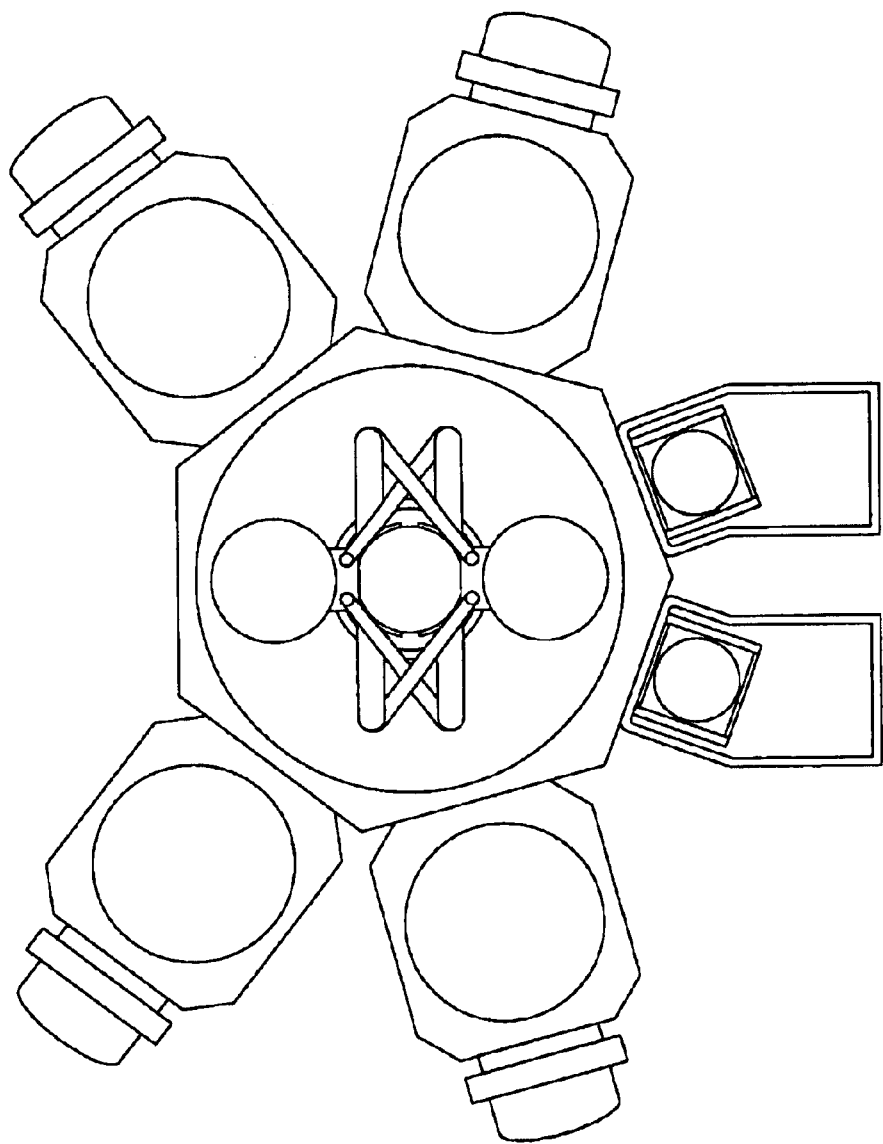
FIG. 13 illustrates an exemplary processing platform that may incorporate embodiments of the invention.

Although FIG. 2 illustrates a general hardware configuration that may be used to implement the cleaning apparatus and method of the invention, alternative hardware configurations may be used to implement/support the cleaning chamber of the invention without departing from the scope of the invention. For example, processing platforms, such as the Producer, Centura, and Endura platforms, all of which are commercially available from Applied Materials of Santa Clara, Calif., may be used to support/implement the cleaning chamber of the invention. An exemplary Endura platform, as described in U.S. Pat. No. 6,251,759, which is hereby incorporated by reference, may implement an embodiment of the cleaning chamber of the invention, as illustrated in FIG. 12. Additionally, an exemplary Centura platform, as described in U.S. Pat. No. 6,074,443, which is hereby incorporated by reference, may also be used to implement an embodiment of the cleaning chamber of the invention, as illustrated in FIG. 13. Additionally, a standard front-end factory interface, which is also commercially available from Applied Materials, may be used to either communicate substrates to one or more particle removal chambers attached directly thereto, or alternatively, a particle removal apparatus may be positioned within the clean air enclosure of the factory interface itself.

B. General Cleaning Chamber Configuration

Figure 3:
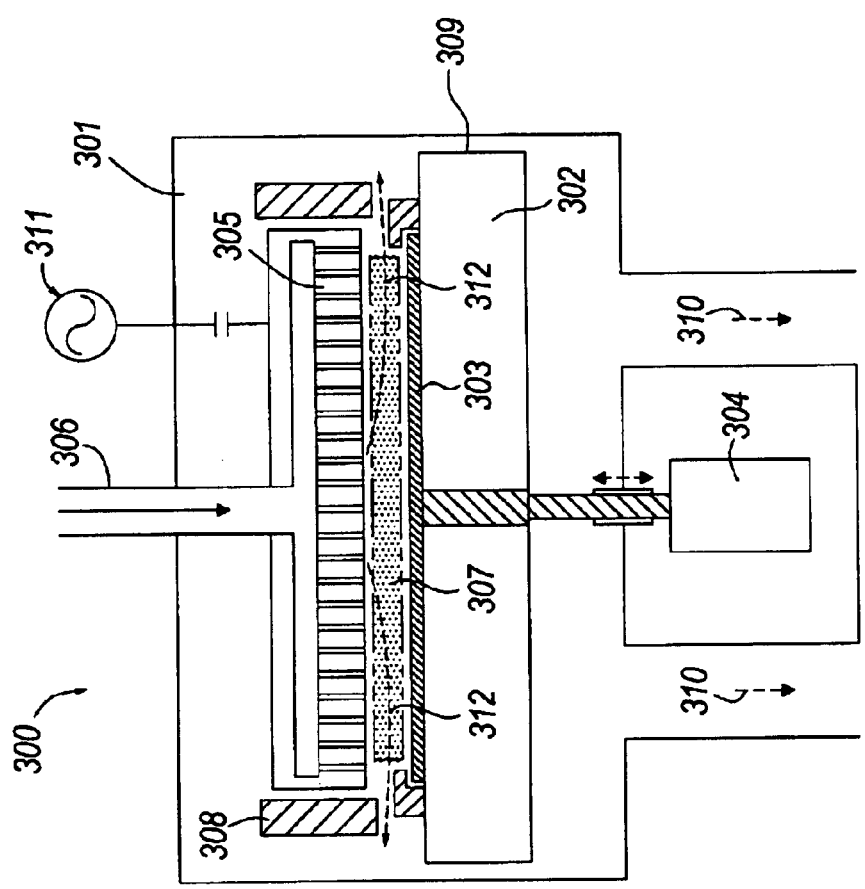
FIG. 3 illustrates an embodiment of a simplified particle removal chamber of the invention.

FIG. 3 illustrates a simplified exemplary substrate cleaning chamber 300 of the invention that may be implemented into system 100, or alternatively, another semiconductor processing platform. Apparatus 300 generally includes a chamber 301 having a substrate support member 302 positioned therein. Chamber 301 is in communication with at least one vacuum pump (not shown) through pump channels 310. Substrate support member 302 is configured to receive and secure a substrate 303 to an upper disk shaped substrate receiving member/surface formed thereon, and may be in communication with a power supply capable of supplying a bias thereto. A gas showerhead 305 is positioned above substrate 303 and is in communication with a gas supply 306. Gas showerhead 305 is manufactured from a conductive material and is in electrical communication with a power supply 311, which may be a radio frequency power supply. Power supply 311 may be capacitively or inductively coupled to the showerhead 305. Showerhead 305 may be surrounded by an annular ground shield 308, and therefore, showerhead 305 may operate as an RF electrode within chamber 301. The lower portion of substrate support member 302 is in communication with an actuator 304 configured to provide an impulse-type force to substrate support member 302 in a direction generally perpendicular to the surface of substrate 303. Actuator 304 may include a piston-type actuator assembly formed into a stem portion of the substrate support member, wherein the actuator is in communication with a selectively actuated propulsion source configured to impart motion to the piston assembly for the purpose of generating a broadband impulse. The piston assembly may be configured to travel within a bore formed into a stem of the substrate support member 302, and further, to contact a terminating end of the bore, thus transferring a broadband impulse to the substrate support member 302. Therefore, the broadband impulse generated by actuator 304 is generally generated along the axis of the substrate support member 302, i.e., perpendicular to the surface of the substrate. Alternatively, actuator 304 may include a device configured to accelerate a plurality of projectiles against a lower surface of the substrate support member 302 such that a broadband impulse sufficient to dislodge contamination particles from a substrate surface is imparted to the substrate support member 302. Further, various pressure differentiator configurations, solenoid configurations, and electromagnetic configurations are contemplated as possible broadband actuator sources.

In operation, a substrate 303 having particles thereon for removal may be positioned in chamber 301 on substrate support member 302. A gas may be introduced into chamber 301 via showerhead 305 and an electrical bias applied between showerhead 305 and substrate support member 302. The combination of the gas and the electrical bias may be calculated to strike a plasma 307 in the area between showerhead 305 and substrate 303. Actuator 304 may then apply an impulse force to substrate support member 302, thus causing substrate support member 302 and the substrate 303 positioned thereon to rapidly accelerate upward. After the initial upward acceleration, the particles on substrate 303 experience a restoring/repulsive force that operates to dislodge the particles from the substrate surface. Once the particles are dislodged, they enter into plasma 307 and become negatively charged. This charge, in conjunction with the gas flow pattern from showerhead 305 to pump channels 310, causes the particles to travel outward above the surface of substrate 303, as generally indicated by arrows 312. The particles are drawn into pump channels 310 via an annular pump channel 309 surrounding substrate support member 302 and are therefore removed from chamber 301.

In another embodiment of chamber 300, the gas showerhead assembly 305, gas supply 306, and power supply 311 may be eliminated. In this embodiment the particles residing on the substrate may still be dislodged from the substrate with an impulse generated by actuator 304, however, a plasma is not utilized to remove the dislodged particles from the area proximate the substrate surface, as in the previous embodiment. Rather, an air knife assembly (not shown) may be implemented into chamber 300 and used to sweep dislodged particles away from the surface of the substrate. The air knife assembly may be positioned in chamber 300 proximate the perimeter of the substrate 303 so that a confined laminar-type stream of high pressure air generated by the air knife assembly may be easily directed toward the substrate surface. The air stream generated by the air knife generally travels proximate the substrate surface in a direction that is generally parallel to the substrate surface so that any particles dislodged therefrom may be swept away from the substrate surface by the air stream.

In another embodiment of chamber 300, the substrate support member 302 may be modified with reinforcement members so that deflection of the substrate support member 302 as a result of the impulse generated by actuator 304 may be minimized. Reinforcement members may include a hemispherically shaped support/reinforcement member positioned between the bottom of substrate support member 302 and the top of the shaft providing support thereto. Other reinforcement structures, such as triangular shaped members, for example, may also be used to reinforce substrate support member 302 and prevent deflection thereof by the impulse generated by actuator 304.

A cleaning chamber of the invention may also include an acoustic monitoring device (not shown) configured monitor the acoustic signature of the substrate support member during the particle removal process. The acoustic monitoring device, which may be a microphone, is in communication with a system controller (not shown). The system controller may be a microprocessor-based control system, for example, configured to receive input from the acoustic monitoring system representative the acoustic signature of the substrate support member during the particle removal process. The measured acoustic signature may be compared to reference signatures by the system controller to determine when a system fault is occurring or is about to occur.

C. Cleaning Chamber Using an Air Knife and a Reinforcement Member

Figure 6:
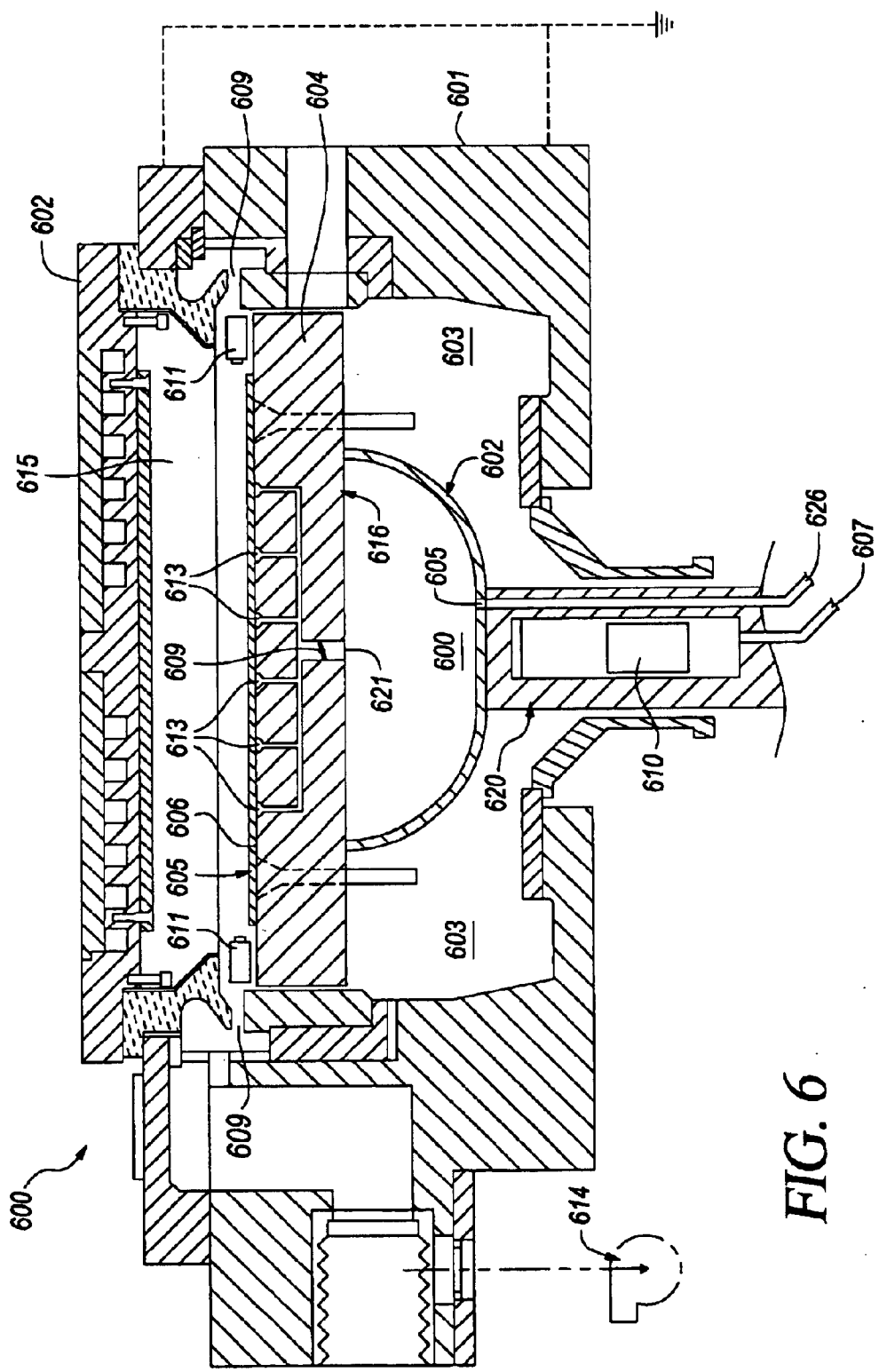
FIG. 6 illustrates an embodiment of a mechanically actuated air knife based particle removal chamber of the invention incorporating substrate support member reinforcement members.

FIG. 6 illustrates a sectional view of an embodiment of a substrate cleaning chamber 600 of the invention. Chamber 600 includes chamber body 601 and a lid 602 that cooperatively define a processing cavity 615 therebetween. A substrate support member 604 is centrally disposed within processing cavity 615 of chamber body 601, and is configured to support a substrate 605 on an upper surface 606 thereof. Substrate support 604 may be manufactured from aluminum, stainless steel, carbon steel, ceramic materials, titanium, and/or other materials used to manufacture substrate support members in the semiconductor art. Additionally, substrate support member 604, as well as other components in chamber 600, may be coated with a non-reactive coating to prevent reactivity with processing fluids, gases, and/or plasmas used in the chamber. Coatings such as polyimide and titanium nitride (TiN), for example, may be used to coat the substrate support member 604, as well as other components of chamber 600, in order to develop resistance to etch plasmas, fluids, and gases that may be used in chamber 600.

Substrate support member 604 may be axially supported by a hemispherical support member 602 affixed to a lower surface 616 of substrate support member 604. Although various configurations for support member 602 are contemplated within the scope of the present invention, such as triangular shaped support members, for example, a hemispherical support member is preferred as a result of the structural strength characteristics exhibited therefrom. Hemispherical support member 602 may be affixed at a first location to a terminating end of shaft 620, which extends through the bottom portion of chamber body 601 to the exterior of chamber 600, where the first location of hemispherical support member 602 corresponds to the location on hemispherical support member 602 having the smallest radius. Hemispherical support member 602 may be affixed to the lower side 616 of substrate support member 602 at a second location, where the second location on hemispherical support member 602 corresponds to the location on hemispherical support member 602 having the largest radius.

The upper surface 606 of substrate support member 604 may include a plurality of vacuum apertures 613 formed therein, where each of apertures 613 is in fluid communication with a vacuum chamber 608 positioned on the lower portion of substrate support member 604. Chamber 608 is defined by the lower surface 616 of substrate support member 604 and the inner walls of the hemispherical support member 602. Substrate 605 may be supported on substrate support member 604 through, for example, a vacuum chucking process, where a vacuum is applied to the plurality of vacuum apertures 613 in order to secure a substrate thereto. The vacuum may be applied to apertures 613 by opening a valve 609 positioned between chamber 608 and apertures 613, thus bringing apertures 613 into fluid communication with vacuum chamber 608. Chamber 608 is in fluid communication with a vacuum pump (not shown) via conduit 626 formed into the lower portion of shaft 620, and therefore, chamber 608 may be maintained at a low pressure. In alternative embodiments, mechanical chucking and/or clamping processes may be implemented individually or cooperatively with a vacuum chucking process to secure a substrate to the substrate support member 604.

Figure 8:
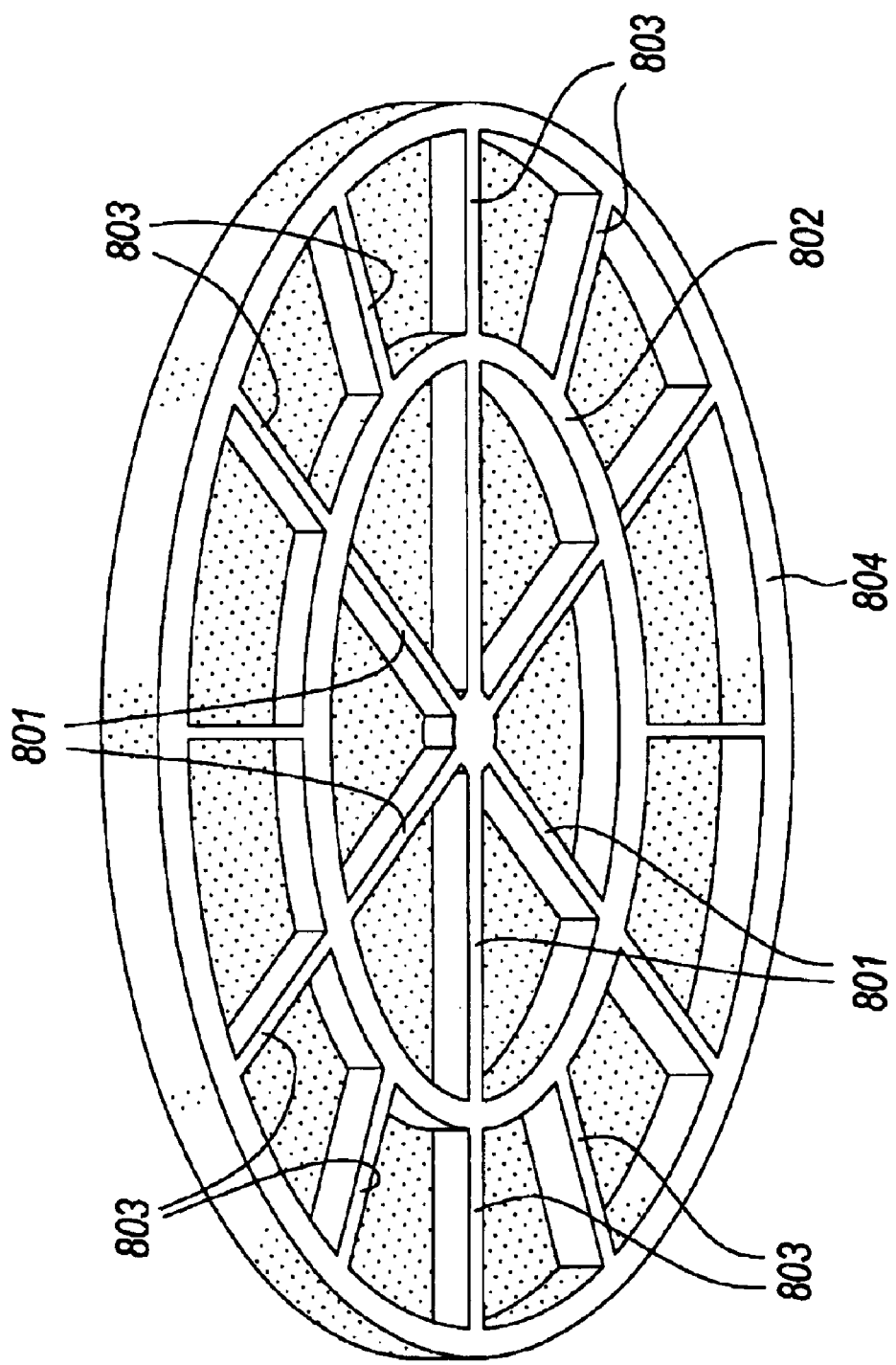
FIG. 8 illustrates a perspective view of an exemplary substrate support member of the invention.

Substrate support member 604 includes an actuator 610 positioned in or proximate to shaft 620 of substrate support member 604. Actuator 610 is configured to generate and transfer a broadband impulse force to substrate support member 604. The broadband impulse force is generally directed upward along the axis of the shaft 620 supporting substrate support member 604 in a direction perpendicular to the surface of substrate 605. Since broadband impulses are used, substrate support member 604 includes a plurality of substrate support member structural reinforcement members, as shown in FIG. 8. The reinforcement members may be manufactured into the table portion of substrate support member 604 and may be configured to transfer the broadband impulse generated by actuator 610 to upper surface 606 with minimal deflection of substrate support member 604. As illustrated in FIG. 8, the lower surface 616 of substrate support member 604 may include a plurality of inner support members 801 extending radially outward from the center of substrate support member 604. The plurality of inner substrate support members 801 may terminate in an intermediate annular support member 802. Intermediate annular support member 802 may be configured to engage the hemispherical reinforcement member 602. The outer portion of substrate support member 604 may include additional outer support members 803 that radially extend from the intermediate annular support member 802 to a perimeter support annulus 804 formed into substrate support member 604 proximate the perimeter thereof. Outer support members 803 may radially extend from an inner substrate support member 801, or alternatively, outer members 803 may radially extend from a location on intermediate annular support member 802 not associated with an inner support member 801. Although a specific structural reinforcement pattern for substrate support member 604 is disclosed in FIG. 8, the invention is not limited to any particular structural support pattern, as other known structural reinforcement patters, such as triangular and honeycomb-type patters, for example, may be implemented in order to reinforce substrate support member 604. Further, although specific size/proportions of the substrate reinforcement members is illustrated in FIG. 8, the invention is not limited to any particular size/proportion of reinforcement members. Various sizes and shapes for the substrate support member and the reinforcing members formed therein may be implemented to satisfy the specific parameters of individual applications.

An annular pumping channel 609 is positioned about the perimeter of the chamber body 601 proximate the edge of substrate support member 604. Pumping channel 609 is in communication with a pumping device 614, such as a vacuum pump, for example. The structural configuration of pumping channel 609, in conjunction with the central location of substrate support member 604, operates to generate a gas flow that radiates outward from the center of substrate support member 604. An air knife assembly 601 configured to generate a confined high pressure laminar-type stream of gas that may be directed proximate the surface of substrate 605 in a direction that is generally parallel to the surface of the substrate is positioned proximate the perimeter of substrate support member 604. Therefore, once actuator 610 has generated a broadband impulse sufficient to dislodge the particles from the substrate surface, air knife 601 may be used to sweep the particles away from the substrate surface and into pumping channel 609 for removal from chamber 600.

In operation, chamber 600 operates to remove particles from a substrate using mechanical forces. The substrate having particles thereon 605 is positioned on substrate support member 604 by a robot (not shown). The substrate 605 is then vacuum chucked to the substrate support member 604 via opening of valve 609, which operates to bring apertures 613 into fluid communication with vacuum chamber 608. Vacuum chamber 608, which is formed by the inner walls of hemispherical support member 602 and the lower surface 616 of substrate support member 604, is in communication with a vacuum source (not shown) via conduit 626. Once substrate 605 is vacuum chucked to substrate support member 604, actuator 610 may be activated, which operates to generate a broadband impulse. The impulse is transmitted through hemispherical reinforcement member 602 into substrate support member 604 and then to substrate 605. This impulse causes the contamination particles on the substrate surface to be dislodged therefrom. Once the particles are dislodged, air knife 601 may be used to flow a laminar stream of high pressure air across the substrate surface, which operates to sweep the dislodged particles away from the substrate surface, thus preventing the particles from re-depositing thereon. The particles may then be removed from chamber 600 via pumping channel 609.

D. Cleaning Chamber Using an Air Bearing and an Air Knife

Figure 7:
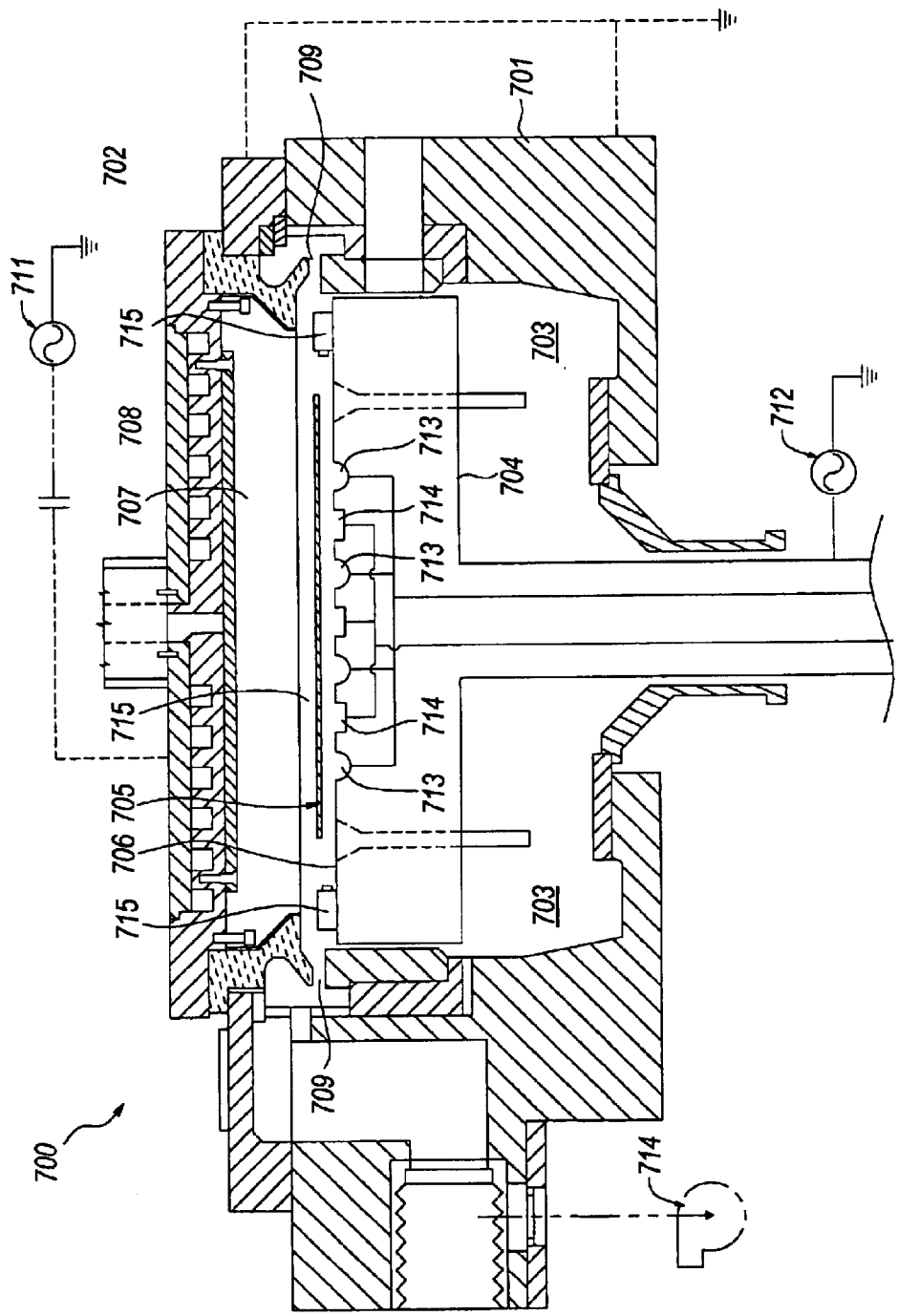
FIG. 7 illustrates an exemplary embodiment of an air bearing based particle removal chamber of the invention.

FIG. 7 illustrates another embodiment of an exemplary substrate cleaning chamber 700 of the invention. Chamber 700 includes a chamber body 701 and a lid portion 702 fitted to the top portion of the body portion 701, so that body 701 and lid portions 702 cooperatively define a processing cavity 703. A substrate support member 704 is centrally disposed within processing cavity 703. Substrate support member 704 is configured to support a substrate 705 in two ways. First, substrate support member 704 is configured to support substrate 705 on an air bearing where a gas is flowed from a plurality of apertures 714 formed into the upper surface 706 of substrate support member 704. The gas flow from apertures 714 creates a cushion of air, often termed an air bearing, that operates to support substrate 705 immediately above the upper surface 706 of substrate support member 704. The distance between upper surface 706 and substrate 705 is generally proportional to the rate of gas flow from apertures 714, and therefore, a larger gas flow generally corresponds to a greater distance. Second, substrate support member 704 is configured to support substrate 705 in a vacuum chucking configuration. More particularly, upper surface 706 also includes one or more vacuum apertures 713 formed therein, each of apertures 713 being in communication with a vacuum source (not shown). Therefore, when the vacuum source is in communication with apertures 713, substrate 705 will be vacuum chucked to substrate support member 703. An air knife assembly 715 is positioned proximate the perimeter of substrate support member 704, and is configured to generate a high pressure confined stream of air configured to sweep dislodged particles away from the substrate surface. An annular pumping channel 709 is positioned about the perimeter of the chamber body 701 proximate the edge of substrate support member 704. Pumping channel 709 is in communication with a pumping device 714, such as a vacuum pump, for example, and therefore, channel 709 is at a vacuum and operates to attract or pull particles into channel 709 once they are swept away from the substrate surface by air knife 715.

In operation, chamber 700 receives a substrate 705 on upper surface 706. Gas apertures 714 are activated and substrate 705 is elevated above upper surface 706 by an air bearing generated between substrate 705 and upper surface 706 as a result of the gas flowing from apertures 714. The gas flow to apertures 714 may then be terminated and a vacuum pump may be brought into communication with the plurality of vacuum apertures 713 positioned on the upper surface 706 of substrate support member 704. The cooperative simultaneous termination of the gas flow to apertures 714 and the communication of a vacuum pump to apertures 713 operates to rapidly eliminate the air bearing supporting substrate 705, while simultaneously generating a negative pressure region between substrate 705 and substrate support member 704. This negative pressure operates to rapidly accelerate substrate 705 toward the upper surface 706 of substrate support member 704. This rapid acceleration operates to dislodge the particles from the wells on the substrate surface. Once the particles are dislodged from the wells, they may be swept away by a laminar stream of high pressure gas generated by air knife 716, which causes a high pressure air stream to be directed across the surface of substrate 705 in a direction that is generally parallel to the substrate surface. This high pressure air flow causes the particles to be swept away from the surface of substrate 705 and toward pumping channel 709. Once the particles are pulled into pumping channel 709, they may be removed/pumped from chamber 700 so that they do not redeposit on substrate 705.

E. Cleaning Chamber Using a Plasma for Particle Removal

Figure 4:
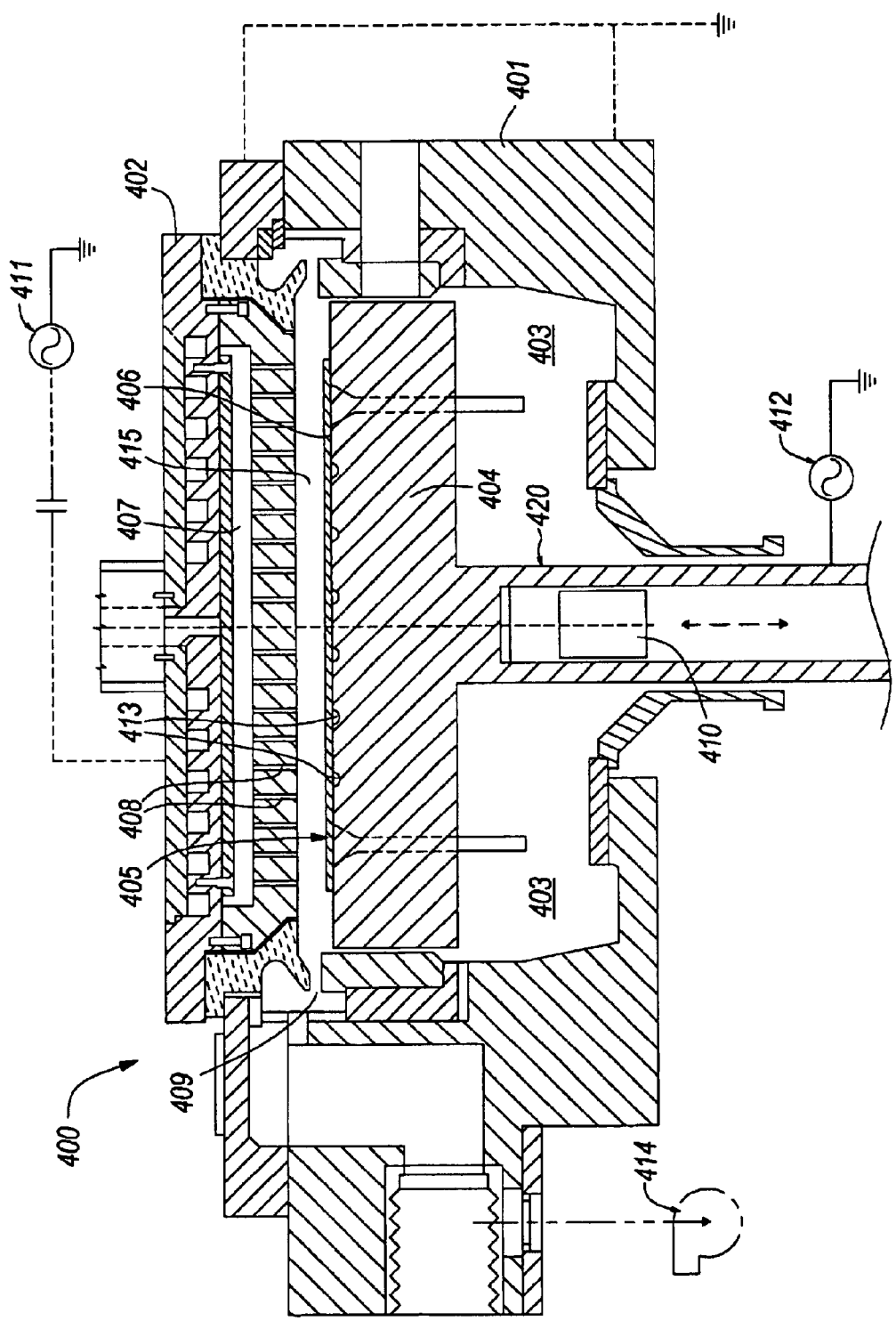
FIG. 4 illustrates a sectional view of an exemplary particle removal chamber of the invention.
Figure 5:
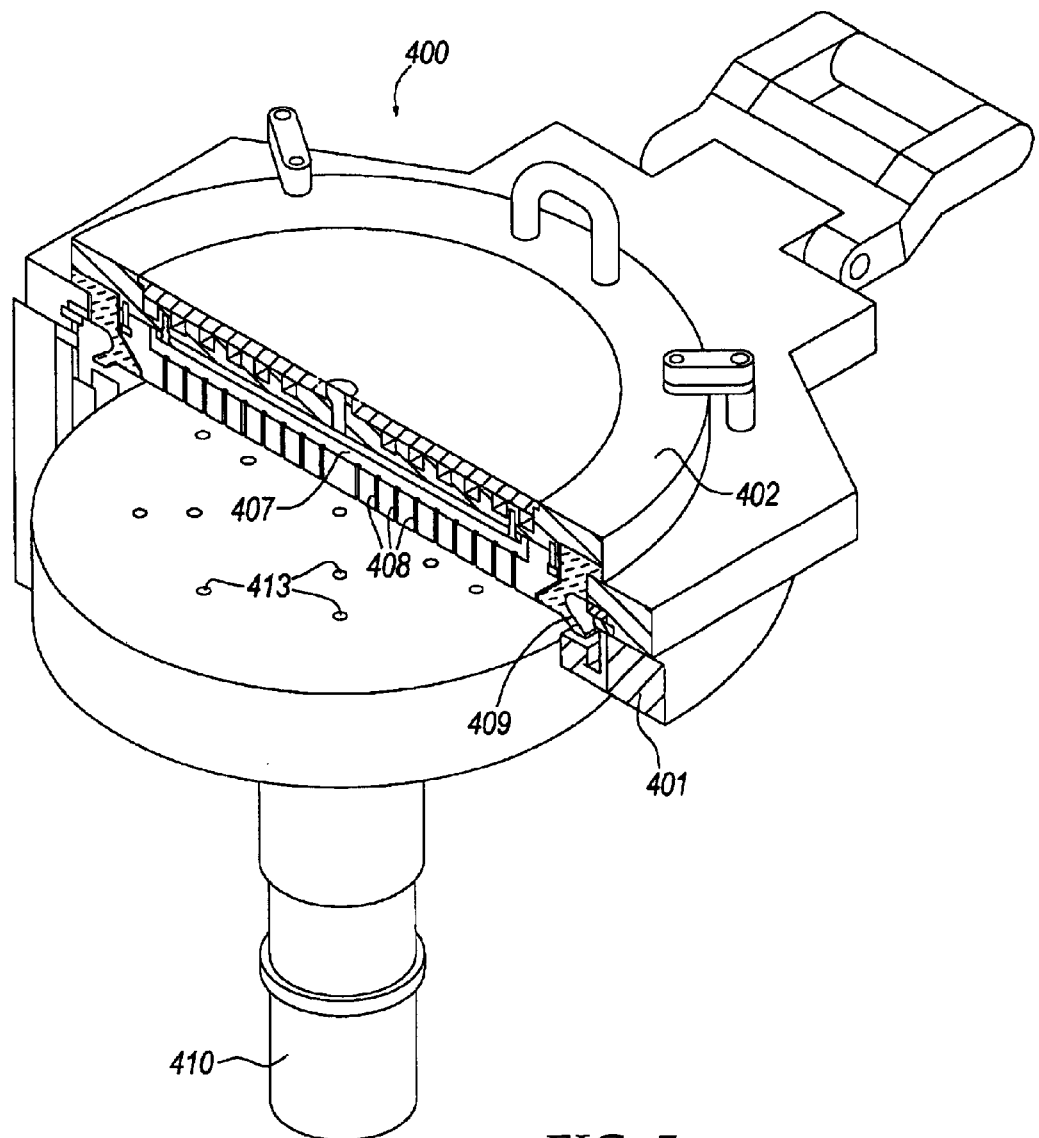
FIG. 5 illustrates a partial perspective view of the exemplary particle removal chamber of FIG. 4.

FIG. 4 illustrates a sectional view of an alternative embodiment of a substrate cleaning chamber 400 of the invention. FIG. 5 illustrates a partial perspective view of the exemplary particle cleaning chamber 400 shown in FIG. 4. Chamber 400 includes a chamber body 401 and a lid 402 that cooperatively define a processing cavity 403 therebetween. A substrate support member 404 is centrally disposed within processing cavity 403 of chamber body 401, and is configured to support a substrate 405 on an upper surface 406 thereof. Substrate support 404 may be manufactured from aluminum, stainless steel, carbon steel, ceramic materials, titanium, and/or other materials used to manufacture substrate support members in the semiconductor art. Additionally, support member 404 may be counted with a non-reactive coating, such as polyimide or titanium-nitride, for example. Substrate support member 404 is axially supported by a shaft 420 extending through the bottom portion of chamber body 401 to the exterior. Upper surface 406 of substrate support member 404 includes a plurality of vacuum apertures 413 formed therein, where each of apertures 413 are in fluid communication with a vacuum source (not shown). Substrate 405 is supported on substrate support member 404 through, for example, a vacuum chucking process, where a vacuum is applied to the plurality of vacuum apertures 413 in order to secure a substrate thereto. In alternative embodiments, mechanical chucking and/or clamping processes may be implemented individually or cooperatively with a vacuum chucking process to secure a substrate to substrate support member 404. Substrate support member 404 includes an actuator 410 positioned in a shaft portion of substrate support member 404. Actuator 410 is configured to generate and transfer a broadband impulse force to substrate support member 404. The broadband impulse force is generally directed upward along the axis of the shaft supporting substrate support member 404 in a direction perpendicular to the surface of substrate 405. Since broadband impulses are used, substrate support member 404 may include one or more structural reinforcement members that may be used to strengthen the substrate support member 404 SO that the impulse generated by actuator 410 does not deflect substrate support member 404. The reinforcement members may be manufactured into the table portion of substrate support member 404 and may be configured to transfer the broadband impulse generated by actuator 410 to the upper surface 406 with minimal deflection of substrate support member 404. Known structural reinforcement patters, such as triangular and honeycomb-type patters, may be implemented into reinforcing substrate support member 404. Additionally, a support member, such as a hemispherical support member, for example, may be implemented between substrate support member 404 and shaft 420 in order to better transfer the impulse from shaft 420 to substrate support member 404.

A showerhead assembly 407 is positioned above substrate support member 404 in lid portion 402. Showerhead assembly 407 includes a plurality of gas distribution apertures 408 configured to flow a gas into a processing area 415 immediately above substrate 405 and immediately below showerhead assembly 407. An annular pumping channel 409 is positioned about the perimeter of the chamber body 401 proximate the edge of substrate support member 404. Pumping channel is in communication with a pumping device 414, such as a vacuum pump, for example. A first power supply 411 is in electrical communication with showerhead assembly, through, for example, a capacitive coupling, and a second power supply 412 is in electrical communication with the substrate support member 404. First and second power supplies 411 and 412 may cooperatively operate to generate an electrical bias between showerhead assembly 407 and substrate support member 404. This electrical bias, which combined with a process gas, may be calculated to strike and maintain a plasma in processing area 413.

In operation, apparatus 400 receives a substrate 405 having contaminant particles thereon on the upper surface 406 of substrate support member 404. Substrate 405 is secured to upper surface 406 by a vacuum chucking process, whereby a vacuum is applied to the plurality of apertures 413 formed into the upper surface 406 of substrate support member 404. This vacuum operates to secure substrate 405 to upper surface 406 via the negative pressure applied to the backside of substrate 406 by apertures 413. Once substrate 405 is secured to substrate support member 404, a low pressure vacuum may be obtained in the processing cavity 403 through activation of pump 414. Once a sufficient pressure is obtained, a plasma may be struck in processing area 415 through application of an electrical bias between showerhead assembly 407 and substrate support member 404, along with introduction of a process gas into process area 415 by showerhead 407. Once the plasma is generated and maintained, actuator 410 may deliver a broadband impulse to substrate support member 404. The broadband impulse may be calculated to dislodge unwanted particles on the surface of substrate 405. Once the particles are dislodged from the substrate surface they enter into the plasma generated in the processing region 415 and become charged as a result thereof. This charge, along with a radial gas flow generated by annular pumping channel 409, operates to draw the particles away from the substrate surface into the plasma, and finally, into pumping channel 409 for removal from the processing area 413.

F. Method for Removing Particles Using a Broadband Actuator and a Plasma

Figure 9B:
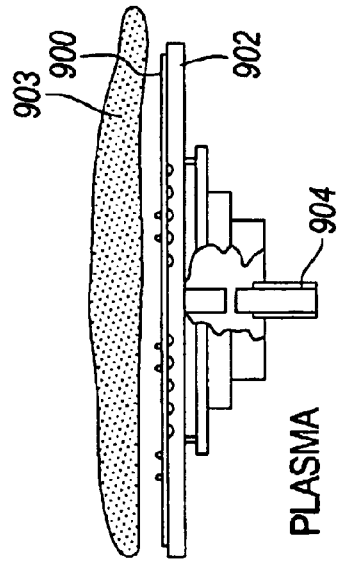
FIGS. 9A–9D illustrate an exemplary method for removing particles from a substrate surface using an actuator to dislodge particles and a plasma sheath to remove the particles from the chamber.
Figure 9D:
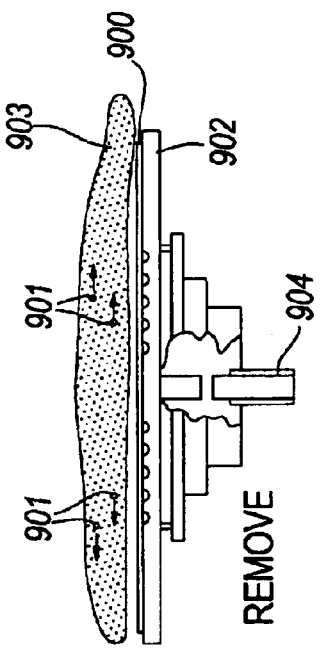
Figure 9A:
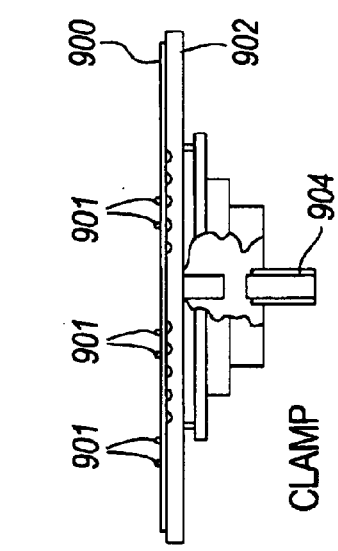

FIGS. 9A–9D illustrate an exemplary method for removing particles from a substrate surface. The exemplary method begins as shown in FIG. 9A, where a substrate 900 having particles 901 thereon is secured to an upper surface of a substrate support member 902 in a particle removal chamber. Substrate 900 may be secured to substrate support member 902 through vacuum chucking, mechanical clamping, or other known methods of securing a substrate to a substrate support member. The lower portion of the substrate support member 902 includes an actuator 904 configured to deliver an impulse to substrate support member 902. Actuator 904 may be a pizo-electric actuator, an electrical actuator, an acoustic actuator, and air operated actuator, or other actuator configured to deliver a broadband impulse to the substrate support member.

Figure 9C:
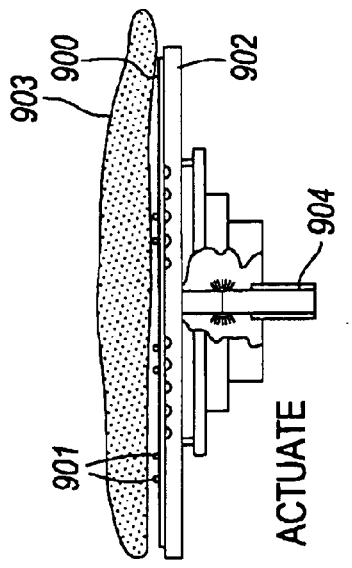

Once the substrate 900 is chucked to substrate support member 902, a plasma 903 is struck immediately above substrate 900, as illustrated in FIG. 9B. The plasma may be generated through, for example, flowing a gas to the area immediately above the substrate while also creating an electrical bias between the substrate support member 902 and, for example, an RF electrode positioned above the substrate support member 902. The gas flow may be introduced into the plasma and pumped away in a configuration calculated to generate a gas flow that radiates away from the center of substrate 900, through, for example, use of a gas showerhead positioned above substrate 900 and a pumping geometry configured to pull gasses outward across the substrate surface. Once the plasma is struck, actuator 904 may deliver at least one broadband impulse to substrate support member 902, as illustrated in FIG. 9C. The broadband impulse causes the substrate support member to initially accelerate in a vertical direction, however, a recoil force in the opposite direction of the initial acceleration immediately follows the initial acceleration and causes substrate support member 902 to recoil towards it's initial position. This recoil action causes particles 901 to be dislodged from the surface of substrate 900, as illustrated in FIG. 9C. Once particles 901 are dislodged, they enter into the outer region of plasma 903, and therefore become electrically charged as a result of contact with plasma 903. This charge operates to draw particles farther away from the surface of substrate 903, thus minimizing the probability that the particle will redeposit on the surface of substrate 900. Once particles 901 are drawn into plasma 903, the particles are urged to travel radially outward by the combination of plasma 903 and radial gas flow generated above substrate 900, as illustrated in FIG. 9D. Particles may then be extracted or pumped from the chamber surrounding substrate support member 902 via vacuum pumps.

G. Method for Removing Particles Using an Air Bearing, a Plasma and/or an Air Knife FIGS. 10A–10D illustrate another exemplary method for removing particles from a substrate surface. The exemplary method begins as shown in FIG. 10A, where a substrate 1000 having contamination particles 1001 thereon is received on an upper surface of a substrate support member 1002 in a contamination removal chamber. Substrate 1000 is received by substrate support member 1002 via an air bearing 1007 formed immediately above the upper surface of the substrate support member 1002. Air bearing 1007 may be formed, for example, by flowing a gas from a plurality of apertures 1004 formed in the upper surface of substrate support member 1002. The gas flow from apertures 104 operates to provide a cushion of gas or air bearing 1007 between the substrate support member 1002 and substrate 1000, thus suspending substrate 1000 just above the upper surface of substrate support member 1002. The distance substrate 1000 is suspended above substrate support member 1002 may be controlled through varying the gas flow rate from apertures 1004 formed into the upper surface of substrate support member 1002, wherein a larger gas flow from apertures 1004 increases the distance substrate 1000 is suspended above substrate support member 1002.

Once the substrate 1000 is received on air bearing 1007, the gas flow to apertures 1004 may be terminated and a vacuum pump may be brought into communication with a plurality of vacuum apertures 1005 positioned on the upper surface of substrate support member 1002. The cooperative termination of the gas flow to apertures 1004 and the communication of a vacuum pump to apertures 1005 operates to rapidly eliminate air bearing 1007 and generate a negative pressure between substrate 1000 and the substrate support member 1002. This negative pressure operates to rapidly accelerate substrate 1002 toward the upper surface of substrate support member 1002, which dislodges particles 1001 from the upper surface of substrate 1000, as illustrated in FIG. 10C. Once particles 1001 are dislodged from the substrate surface, a gas knife assembly 1006 may be activated, which causes a high pressure air stream to be directed across the surface of substrate 1000 that causes particles 1001 to be swept away from the surface of substrate 1000, as illustrated in FIG. 10D.

In another embodiment of the method illustrated in FIGS. 10A–10D, a vacuum chamber may be placed in communication with apertures 1005 via a selectively actuated valve. Therefore, when the air bearing is to be terminated, the vacuum chamber may be brought into fluid communication with apertures 1005, which causes a rapid decrease in pressure behind substrate 1000. The rapid decrease in pressure generally results from the large volume of negative pressure resident in the vacuum chamber being in communication with apertures 1005, which operates to supply vacuum to apertures 1005 more rapidly than using a conventional vacuum pump.

In an alternative embodiment, a plasma 1003 may be struck immediately above substrate 1000, as illustrated in FIG. 10B, at the same time that the substrate is being supported on the air bearing. The plasma may be generated through, for example, flowing a process gas to the processing area immediately above substrate 1000, while also applying an electrical bias between the substrate support member 1002 and an electrode positioned above substrate support member 1002. The process gas flow may be introduced into plasma 1003 and pumped away in a configuration calculated to generate a gas flow that radiates away from the center of substrate 1000, through, for example, use of a gas showerhead positioned above substrate 1000 and a pumping geometry configured to pull gasses outward across the substrate surface toward the perimeter of substrate 1000. Once plasma 1003 is struck and maintained, the gas flow to apertures 1004 may be terminated and a vacuum pump may be brought into communication with a plurality of vacuum apertures 1005 positioned on the upper surface of substrate support member 1002 to dislodge the particles from the substrate surface. Thereafter, the particles may be absorbed by plasma 1003 and pumped from the chamber in a like fashion to the air knife embodiment.

H. Method for Removing Particles Using a Broadband Actuator and an Air Knife

Figure 11A:
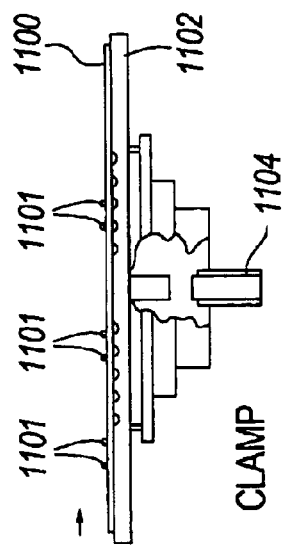
FIGS. 11A–11C illustrate an exemplary method for removing particles from a substrate using a broadband actuator and an air knife.
Figure 11C:
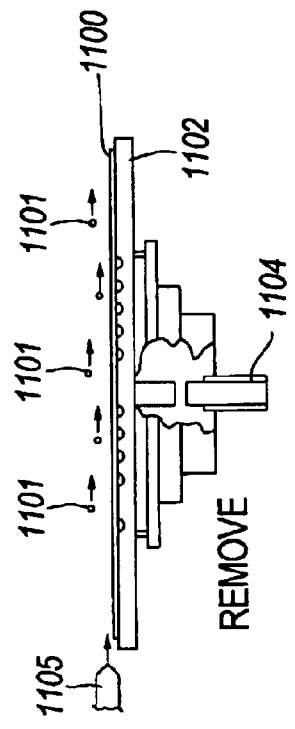

FIGS. 11A–11D illustrate another exemplary method for removing particles from a substrate surface. The exemplary method begins as shown in FIG. 11A, where a substrate 1100 having contamination particles 1101 thereon is secured to an upper surface of a substrate support member 1102 in a contamination removal chamber, generally through a vacuum chucking process. Although substrate 1100 is secured to substrate support member 1102 through a vacuum chucking, process, alternative substrate chucking/securing methods, such as mechanical clamping, for example, may also be implemented. The lower portion of the substrate support member 1102 is in communication with an actuator 1104. Actuator 1104 is configured to deliver a broadband impulse to substrate support member 902 sufficient to dislodge contamination particles therefrom. Actuator 904 may be a pizo-electric actuator, an electrical actuator, an acoustic actuator, and air operated actuator, a mechanical actuator, or other actuator configured to deliver a broadband impulse to substrate support member 1102.

Figure 11B:
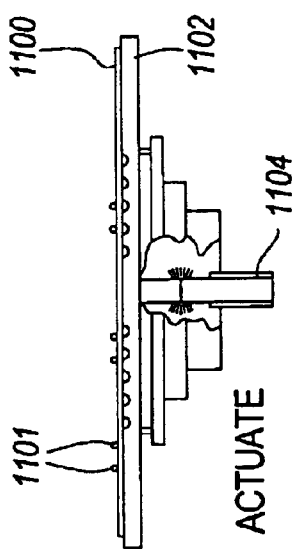

Once the substrate 1100 is chucked to substrate support member 1102, actuator 1104 may deliver at least one broadband impulse to substrate support member 1102, as illustrated in FIG. 11B. The broadband impulse causes the substrate support member to initially accelerate in a vertical direction, however, a recoil force in the opposite direction of the initial acceleration immediately follows the initial acceleration and causes substrate support member 1102 to recoil towards it's initial position. This recoil action causes particles 1101 to be dislodged from the surface of substrate 1100. Once particles 1101 are dislodged, an air knife assembly 1105 operates to dispense a high pressure laminar-type gas flow in a confined area immediately above the surface of the substrate 1100. This "knife" of air facilitates the removal of dislodged particles 1101 from the area proximate surface of substrate 1100, and causes the dislodged particles 1101 to be swept away from substrate 1100 toward the outer perimeter of the substrate 1100. Once the dislodged particles 1101 are swept away from substrate 1100, the particles 1101 may then be extracted or pumped from the chamber surrounding substrate support member 1102 via vacuum pumps.

While the foregoing is directed to embodiments of the present invention, other and further embodiments of the invention may be devised without departing from the basic scope thereof, and the scope thereof is determined by the claims that follow.

What is claimed is:

1. A multistage semiconductor processing tool, comprising:

a first transfer chamber having a first substrate transfer robot positioned therein;

at least one load lock chamber in communication with the first transfer chamber, the at least one load lock being configured to communicate substrates into and out of the first transfer chamber;

at least one substrate cleaning chamber positioned in communication with the first transfer chamber, the at least one substrate cleaning chamber comprising:

a substrate support member;

a broadband actuation device in communication with the substrate support member; and a particle removal device configured to sweep away dislodged particles from an area proximate the substrate surface;

a second transfer chamber having a second substrate transfer robot positioned therein, the second transfer chamber being in selective communication with the first transfer chamber; and at least one substrate processing chamber in communication with the second transfer chamber.

2. The processing tool of claim 1, wherein the substrate support member comprises:

an annularly shaped substrate receiving member having a substantially planar upper substrate receiving surface formed thereon;

a reinforcement member affixed to an underside of the substrate receiving member;

a substrate support member stem affixed to a lower portion of the reinforcement member; and a broadband actuation device positioned in mechanical communication with the substrate support member stem.

3. The processing tool of claim 1, wherein the annularly shaped substrate receiving member includes a plurality of reinforcement members formed into the underside, the plurality of reinforcement members being configured to prevent deflection of the substrate receiving member.

4. The processing tool of claim 2, wherein the broadband actuation device comprises a slidable piston assembly positioned in a cylindrical cavity formed into an interior portion of the substrate support member stem, the piston assembly being configured to impact a terminating end of the cylindrical cavity and generate a broadband impulse therefrom.

5. The processing tool of claim 1, further comprising a inspection station in communication with the first transfer chamber.

6. The processing tool of claim 5, wherein the inspection station is configured to detect the presence of contaminant particles on a surface of the substrate.

7. A semiconductor processing tool, comprising:

a central transfer enclosure;

a substrate transfer robot positioned in the central transfer enclosure;

at least one substrate processing chamber in communication with the central transfer chamber; and at least one load lock chamber in communication with the central transfer enclosure, wherein at least one of the substrate processing chambers are configured as a particle removal chamber comprising a substrate support member having a broadband actuator positioned in a stem portion and a reinforcement member positioned between the stem portion and a substrate receiving member.

8. The processing tool of claim 7, wherein the broadband actuator comprises a selectively actuated piston assembly longitudinally positioned in the stem portion, the piston assembly being configured to contact a terminating end of a piston bore to generate a broadband impulse.

9. The processing tool of claim 7, wherein the reinforcement member comprises a support member having an open end and a substantially closed end, the open end being in communication with a lower surface of the substrate receiving member and the substantially closed end being in communication with the stem portion.

10. The processing tool of claim 7, wherein the substrate receiving member further comprises a plurality of reinforcement ribs formed into a lower surface thereof, the plurality or reinforcement ribs being configured to minimize deflection of the substrate receiving member.

11. The processing tool of claim 7, wherein the particle removal chamber further comprises an air knife assembly configured to generate a laminar flow of gas across the substrate surface.

12. The processing tool of claim 7, wherein the particle removal chamber further comprises:

a showerhead assembly positioned above the substrate support member;

at least one power supply in communication with at least one of the substrate support member and the showerhead assembly, the power supply being configured to apply an electrical bias sufficient to generate a plasma above the substrate support member; and an annular pumping channel circumscribing a perimeter of the substrate support member, the annular pumping channel being in communication with a vacuum source.

13. The processing tool of claim 7, wherein the reinforcement member defines a cavity with a lower surface of the substrate receiving member, the cavity being in communication with a vacuum source and selectively in communication with a plurality of vacuum channels formed into a substrate receiving surface, the vacuum channels being configured to vacuum chuck a substrate thereto.

14. The processing tool of claim 7, wherein at least one of the substrate processing chambers comprises a inspection chamber.

15. The processing tool of claim 14, wherein the inspection chamber is configured to detect the presence of contaminant particles on a surface of the substrate.

* * * * *